United States Patent [19]

Hodgson et al.

[11] Patent Number: 5,006,412

[45] Date of Patent: Apr. 9, 1991

[54] SUBSTRATE OF METAL-COMPLEXED BETA-DIKETONE/THERMOSETTING POLYMER REACTION PRODUCT

[75] Inventors: Susan A. Hodgson, Ossining; Jae M. Park, Binghamton; Richard R. Thomas, Fishkill, all of N.Y.

[73] Assignee: International Business Machines Corporation, Armonk, N.Y.

[21] Appl. No.: 385,505

[22] Filed: Jul. 27, 1989

Related U.S. Application Data

[62] Division of Ser. No. 183,101, Apr. 19, 1988, Pat. No. 4,868,253.

[51] Int. Cl.$^5$ .................. B32B 15/04; B32B 15/08
[52] U.S. Cl. ............................ 428/458; 428/457; 428/938; 525/420; 525/436; 525/504; 525/533; 528/119; 528/292
[58] Field of Search ............... 525/420, 436, 504, 533, 525/523; 528/119, 292; 428/457, 458, 938

[56] References Cited

U.S. PATENT DOCUMENTS

| | | | |
|---|---|---|---|
| 3,995,489 | 12/1976 | Smith et al. | 524/321 |
| 4,087,411 | 5/1978 | Sugio et al. | 525/398 |
| 4,102,809 | 7/1978 | Smith et al. | 524/321 |
| 4,271,275 | 6/1981 | MacLachlan | 525/385 |
| 4,602,070 | 7/1986 | Cavitt et al. | 525/528 |

*Primary Examiner*—John C. Bleutge
*Assistant Examiner*—Robert E. L. Sellers, II
*Attorney, Agent, or Firm*—Pollock, Vande Sande & Priddy

[57] ABSTRACT

A reaction product of a $\beta$-diketone and a polymer having groups that are reactive with the $\beta$-diketone can be complexed with a metal. The reaction product having the complex metal can be activated to provide a substrate suitable for plating from an electroless metal plating bath.

8 Claims, No Drawings

SUBSTRATE OF METAL-COMPLEXED BETA-DIKETONE/THERMOSETTING POLYMER REACTION PRODUCT

This is a divisional of Ser. No. 07/183,101, filed on Apr. 19, 1988, now U.S. Pat. No. 4,868,253.

DESCRIPTION

1. Technical Field

The present invention is concerned with reaction products of β-diketones, for example malonamide, and is especially concerned with reaction products that can be complexed with a metal. The present invention is particularly concerned with those reaction products that can be activated to provide a surface suitable for plating thereon of a metal from an electroless plating bath.

2. Background Art

In the manufacture of printed circuit cards and boards a non-conductive material is employed as the substrate. A conductive circuit pattern is provided on one or both of the major surfaces of the substrate.

A conductive pattern can be formed on the surface(s) of the substrate using a variety of known techniques. These known techniques include the subtractive technique whereby a layer of conductive metal such as copper is etched to form the desired circuit pattern, the EDB (electroless direct bond) technique whereby a conductive metal such as copper is plated from an electroless plating bath directly onto the surface of the substrate in the desired pattern, and the peel-apart technique where the desired circuit pattern is plated up from a thin layer of what is referred to as a "peel-apart metal" such as peel-apart copper.

In any of these techniques, connections between layers are made by means of plated through-holes. In plating such holes the metal, such as copper, must be plated directly onto the non-conductive substrate (on the walls of the holes). Furthermore, if one employs the EDB technique, one must plate directly on the surface of the substrate.

In view of the nature of the substrate being inactive for EDB, in order to plate on the substrate, the substrate must be seeded or catalyzed prior to deposition of metal thereon.

Among the more widely employed procedures for catalyzing a substrate is the use of a stannous chloride sensitizing solution and a palladium chloride activator to form a layer of metallic palladium particles. One such method for catalyzing a dielectric substrate is employed in U.S. Pat. No. 3,011,920 to Shipley which includes sensitizing a substrate by first treating it with a solution of a colloidal metal, accelerating the treatment with a selective solvent to remove protective colloids from the sensitized non-conductive substrate, and then electrolessly depositing a metal coating on the sensitized substrate; for example, with copper from a solution of a copper salt and a reducing agent.

As the demands over the years for more complex circuitry and for finer lines have increased, continuing efforts have been made in the refinement of the seeding or catalyzing procedures. However, there still exists room for improvement in the seeding or catalyzing procedures for increased reliability and enhanced adhesion of the catalyst to the substrate without significantly

SUMMARY OF INVENTION

Summary of Invention The present invention is concerned with a reaction product that finds particular applicability in providing material for a substrate capable of having a metal plated thereon from an electroless metal plating bath. In particular, the reaction product of the present invention is a β-diketone with a polymeric material that has groups which are reactive with the β-diketone, such as the amide functionality in malonamide.

Moreover, the present invention is concerned with a substrate that is suitable for plating of a metal thereon from an electroless plating bath that includes a reaction product of a β-diketone and a polymeric material having groups that are reactive with the β-diketone and having a metal complexed with the reaction product.

Another aspect of the present invention is concerned with a method for plating a metal on a dielectric substrate from an electroless metal plating bath. The method comprises providing a substrate that comprises a reaction product of a β-diketone and a polymeric material having groups that are reactive with the β-diketone.

An active metal, not necessarily a conductive metal, but one that will act as a seed for electroless plating is complexed with the reaction product. A typical metal being palladium. The complexed metal is activated and the substrate is then contacted with an electroless metal plating bath to plate metal thereon.

BEST AND VARIOUS MODES FOR CARRYING OUT THE INVENTION

The present invention is concerned with reaction products of a β-diketone and a polymeric material that has groups which are reactive with the β-diketone. The reaction products are curable and are capable of complexing to metal ions due to the β-diketone employed. Examples of β-diketones are malonic acid, malonyl chloride, and malonamide. The preferred β-diketone employed is malonamide.

Malonamide is a betadiketone having amide groups at both ends of the molecule. In particular, malonamide can be represented by the following structural formula:

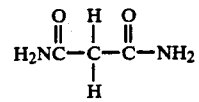

It is believed that the methylene linkage which, in the case of malonamide, is between the two amide groups of the malonamide, for example, is a key factor in the successful operation of the invention.

The polymeric materials employed are preferably thermosetting polymeric materials and include epoxide polymers, polyimides, and polyamides.

The preferred polymeric materials employed in accordance with the present invention are the epoxy resinous materials. Typical epoxy resins include the bisphenol-A type resins obtained from bisphenol-A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane, and alicyclic epoxy resins such as bis(3,4-epoxy-6-methylcyclohexylmethyl) adipate. The most preferred epoxy employed is of the bisphenol-A type. Of course, other types of epoxy polymers can be employed and include those obtained by reacting a polynuclear dihydric phenol with a halo-epoxy alkane in general.

Suitable polynuclear dihydric phenols can have the formula:

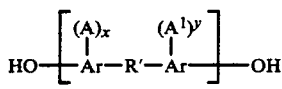

wherein Ar is an aromatic divalent hydrocarbon such as naphthalene and more usually phenylene, A and Al which can be the same or different are alkyl radicals generally having from 1 to 4 carbon atoms, halogen atoms, e.g., fluorine, chlorine, bromine, and iodine, or alkoxy radicals generally having from 1 to 4 carbon atoms, x and y are integers having a value 0 to a maximum value corresponding to the number of hydrogen atoms on the aromatic radical (Ar) which can be replaced by substituents and $R^1$ is a bond between adjacent carbon atoms as in dihydroxydiphenyl or is a divalent radical including, for example,

—O—, —S—, —SO—, —SO$_2$—, and —S—S— and divalent hydrocarbon radicals such as alkylene, alkylidene, cycloaliphatic, e.g., cycloalkylene and cycloalkylidene, halogenated, alkoxy or aryloxy substituted alkylene, alkylidene and cycloaliphatic radicals as well as alkarylene and aromatic radicals including halogenated, alkyl, alkoxy, or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others, the bis-(hydroxyphenyl)alkanes such as 2,2-bis-(4-hydroxyphenol)propane, 2,4'-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1-bis-(4-hydroxyphenyl)ethane, 1,2-bis-(4-hydroxyphenyl)ethane, 1,1-bis(4-hydroxy-2-chlorophenyl)ethane, 1,1-bis(3-methyl-4-hydroxyphenyl) ethane, 1,3-bis-(3-methyl-4-hydroxyphenyl)propane, 2,2-bis-(3-phenyl-4-hydroxyphenyl)propane, 2,2-bis-(3-isopropyl-4-hydroxyphenyl)propane, 2,2-bis(2-isopropyl4-hydroxyphenol)pentane, 2,2-bis-(4-hydroxyphenyl) heptane, bis-(4-hydroxyphenyl)phenylmethane, bis-(4-hydroxyphenyl)cyclohexylmethane, 1,2-bis-4-hydroxyphenyl)-1,2-bis-(phenyl)propane and 2,2-bis-(4-hydroxyphenyl)-1-phenyl-propane; di(hydroxyphenyl) sulfones such as bis(4-hydroxyphenyl)sulfone, 2,4'-dihydroxydiphenyl sulfone, 5'-chloro-2,4'-dihydroxydiphenyl sulfone, and 5'chloro-4,4'-dihydroxydiphenyl sulfone; di(hydroxyphenyl)ethers such as bis-(4-hydroxyphenyl)ether, the 4,3'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl) ether, bis-(4-hydroxy-3-chlorophenyl)-ether, bis-(4-hydroxy-3-fluorophenyl)ether, bis-(4-hydroxy-3-bromophenyl)ether, bis-(4-hydroxynaphthyl)-ether, bis-(4-hydroxy-3-chloronaphthyl)-ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

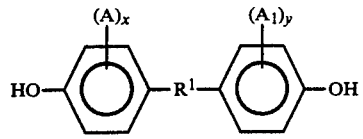

wherein A and A$_1$ are as previously defined, x and y have values from 0 to 4 inclusive and $R^1$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol-A, i.e., 2,2-bis(p-hydroxyphenyl)propane.

The halo-epoxy alkane can be represented by the formula:

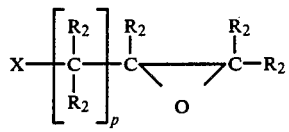

wherein X is a halogen atom (e.g., chlorine, bromine, and the like), p is an integer from 1–8, each R$_2$ individually is hydrogen or alkyl group of up to 7 carbon atoms; wherein the number of carbon atoms in any epoxy alkyl group generally totals no more than 10 carbon atoms.

While glycidyl ethers, such as derived from epichlorohydrin, are particularly preferred, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxy-propane, 1-bromo-2,3-epoxypentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane.

The polyimides employed are also well-known and are available commercially. Such are sometimes referred to as polyamide-acids or polyimide/amide polymers.

The imide groups are obtained by condensation of the amide form with an acid group of the polymer chain. Such polymers are generally prepared by reacting at least one diamine with at least one polycarboxylic acid and/or anhydride thereof and/or ester thereof. Suggestions of various polyimide/amides can be found in U.S. Pat. Nos. 2,710,853; 2,712,543; 2,731,447; 2,880,230; 3,037,966; 3,073,784; 3,073,785; 3,179,631; 3,179,632; 3,179,633; 3,179,634; 3,179,635; and 3,190,856, disclosures of which are incorporated herein by reference. The preferred polyimide polymers employed are those obtained by reacting an aromatic diamine with an aromatic tetracarboxylic acid dianhydride.

Examples of some anhydrides employed in preparing the polyimide are pyromellitic dianhydride; mellitic anhydride; trimellitic anhydride; 2,3,6,7-naphthalene tetracarboxylic dianhydride; 1,2,5,6-naphthalene tetracarboxylic dianhydride, 3,3',4,4'-diphenyltetracarboxylic dianhydride; 2,2',3,3'-diphenyltetracarboxylic dianhydride, 3,3',4,4'-diphenylmethane tetracarboxylic dianhydride; bis(3,4-carboxyphenyl)ether dianhydride; bis(2,3-dicarboxyphenyl)sulfone dianhydride; 3,3',4,4'benzophenone tetracarboxylic dianhydride; 3,3',4,4'benzophenone tetracarboxylic dianhydride; 3,3',4,4'stilbenetetracarboxylic dianhydride; 2,3,6,7-anthracenetetracarboxylic dianhydride; 1,2,7,8-phenanthrenetetracarboxylic dianhydride; 2,3,6,7-naphthacene tetracarboxylic dianhydride; 2,3,8,9-chrysene tetracarboxylic dianhydride; 2,3,6,7,-triphenylene tetracarboxylic dianhydride; pyrene-4,5,9,10-tetracarboxylic dianhydride; perylene-3,4,9,10-tetracarboxylic dianhydride; and coronene-1,2,7,8-tetracarboxylic dianhydride.

Examples of some aliphatic organic diamines are ethylenediamine; N-methylethylenediamine; trimethylenediamine; tetramethylenediamine, 1,5-diaminopentane; hexamethylenediamine; 1,4-diaminocyclohexane; 1,3-diaminocyclopentane; 1,3-diamino-2-methylpropane; 1,6-diamino-4-methylhexane; 1,4-diamino-2-methyl butane; 1-N-propylamino)-6-aminohexane; and 1,3-diamino-2phenylpropane.

Examples of some aromatic-aliphatic diamines are paraaminophenylmethylamine, and meta-aminophenylmethylamine. Examples of some aromatic organic diamines are 2,2-di(4-aminophenyl)propane; 4,4'-diaminodiphenylmethane; benzidine; mono-N-methylbenzidine, 3,3'-dichlorobenzidine; 4,4'-diaminodiphenylsulfide; 3,3'-diaminodiphenyl sulfone; 4,4'-diaminodiphenyl sulfone; 4,4'-diaminodiphenyl ether; 1,5-diaminonaphthalene; meta-phenylenediamine; para-phenylenediamine; 3,3'-dimethyl-4,4'biphenyldiamine; 3,3'-dimethoxybenzidine; 1-isopropyl-2,4phenylenediamine; 3,5-diaminoorthoxylene; 3,5-diaminodiphenyl; 1,3-diaminoaphthalene; 2,6-diamino anthracene; and 4,4'-diaminostilbene. The most preferred aromatic diamines are 4,4'-diaminodiphenyl ether, 4,4'-diaminodiphenylmethane, and paraphenylenediamine.

The polyamides are well-known and are also commercially available. Such are condensation products that contain recurring amide groups (CONH) as integral parts of the polymer chain. For instance, the polyamides can be formed from the condensation of diamines and dibasic acids.

The relative amount of the β-diketone to polymeric material is usually such that at least 0.1% to about 80% of the reactive groups of the polymeric materials are reacted with the β-diketone and preferably about 5% to about 60%.

In the preferred aspects of the present invention, the β-diketone should be completely reacted and no free β-diketone present in the composition.

The reaction between the polymeric material and β-diketone is usually carried out in an organic solvent and at temperatures between about 100° C. to about 200° C., typical of which is about 150° C. The reaction is normally completed in about ½ hour to about 5 hours, typical of which is about 2 hours to 2 ½ hours.

Typical solvents include dimethylformamide, dimethylacetamide, dimethylsulfoxide, and 1-methyl-2-pyrrolidinone. The amount of solvent employed is usually between about 30% to about 70% based upon the combined weight of the β-diketone and polymeric material.

The reaction is preferably carried out in the presence of an inorganic base that acts as catalyst. Typical materials include sodium hydroxide and potassium hydroxide.

The polymeric material should be present in large excess, such as at least about two times the amount necessary to react with all of the β-diketone in order to avoid rapid crosslinking of the polymeric material.

The reaction products can be contacted with a composition that contains a metal in order to form a complex of the reaction product and the metal ions so that the reaction product can serve as a surface for plating of a metal thereon from an electroless plating bath. The preferred metals are such as palladium, platinum, ruthenium, nickel, and copper.

Generally, the amount of metal is about 0.1% to about 20% and preferably about 1% to about 10% by weight based upon the methylene linkages from the β-diketone in the reaction product. The complexing with the metallic ion is achieved in the presence of a basic catalyst such as a tertiary amine such as trimethylamine or triethylamine; and inorganic bases such as potassium hydroxide and sodium hydroxide.

The reaction with the metal is usually carried out at about room temperature to about 100° C. and preferably at about room temperature. The reaction is usually completed in 0.5 minute to about 2 hours and preferably 1 minute to about 1 hour. The reaction is usually carried out in an organic solvent such as 1-methyl-2-pyrrolidinone.

When the reaction product complexed with the metal ions is to be employed in a substrate for plating a metal thereon from an electroless plating bath, such can be used alone or can be admixed with other dielectric materials employed for such purpose, including the epoxy, polyamides, and polyimides generally used for such purposes.

The compositions can also be molded articles of the polymers that contain fillers and/or reinforcing agents such as glass fibers. In addition, it may be desirable to add accelerating agents and curing agents as well known in the art. For instance, examples of suitable curing agents for epoxy compositions include polyamines; primary, secondary, and tertiary amines; polyamides; polysulfones; urea-phenol-formaldehyde; and acids or anhydrides thereof. Also, suitable curing agents include Lewis acid catalysts such as $BF_3$ and complexes thereof.

The substrate usually contains fillers and/or reinforcing agents such as glass fibers. Such compositions containing fibers are usually prepared by impregnating the fibers with the polymeric composition. The amount of polymer composition when combined with the fibers is usually about 30% to about 70% by weight and more usually about 55% to about 65% by weight of the total of the solids of the polymer composition and the fiber.

After combining with the reinforcing fibers, the composition is cured to the B-stage and molded to the desired shape such as a sheet. When sheets are employed, the thickness is usually about 1.5 mils to about 8 mils and more usually about 2 mils to about 3 mils. The curing of the B-stage is usually achieved by using temperatures of about 80° C. to about 110° C. and for times of about 3 minutes to about 10 minutes.

The substrate can then be laminated onto another supporting substrate as is generally practiced.

For instance, the bonding of substrates can be carried out by pressing together a number of sheets in the substrate in a pre-sheeted laminating press at a predetermined pressure and temperature as, for example, about 200 psi to about 500 psi and more usually about 250 psi to about 300 psi at about 180° C.

The time for the pressing operation is variable, depending upon the particular materials employed and the pressures applied. About 1 hour is adequate for the above conditions.

Prior to activating the metal for the subsequent plating thereon, the required through-holes in the substrate can be made in the dielectric with the through-holes being suitably cleaned and preconditioned if so desired as practiced in the prior art.

The reaction product can be activated in selective areas to convert the metal ions that are complexed into metallic catalytic particles such as by an oxygen plasma treatment. The activation can be carried out employing a gaseous plasma of an oxygen-containing gas and a fluorinated compound suitable for etching the surface of the polymer. Preferred oxygen-containing gas employed is oxygen, per se. Suitable fluorinated compounds include $CF_4$, $C_2F_6$, $CFCl_3$, $CF_3Cl$, $SF_6$, $CCl_2F_2$, and $NF_3$ with the most preferred fluorinated compound being $CF_4$. The relative amounts of the oxygen-containing gas in the fluorinated compound will depend upon the specific fluorinated compound employed and the particular dielectric substrate material. However, the amounts can be readily determined without undue experimentation by merely determining the maximum etch rate as a function of different gas-feed composition.

For instance, with $CF_4$ as the fluorinated compound, mole ratios of $O_2$ to $CF_4$ of 60–90:40–10 are suitable. The activation step is usually completed within about 1 minute to about 40 minutes and more usually about 10 minutes to about 25 minutes and is generally carried out at about room temperature to less than the degradation temperature of the reaction product. The gas residence time is usually about 1 second to about 5 minutes and more usually about 1 second to about 1 minute.

The pressure employed is generally about 100 millitorr to about 500 millitorr. Typical power levels are about 0.05 watts to about 2 watts per square centimeter of one major surface of the substrate being treated.

Plasma reactors suitable for carrying out the activation step are commercially available and need not be discussed herein in any detail. Typical commercially available plasma reactors suitable are Branson IPCParallel Plate Reactor Model 74-15; In-line Plasma System available from Kosai, Applied Plasma Systems, Plasma Reactors; and Technics' Plasma Reactor.

After the activation is carried out, the substrate is ready for plating of a conductive metal thereon from an electroless plating bath to plate those areas of the substrate activated. Examples of suitable metals are nickel, gold, and preferably copper. The preferred copper electroless plating baths and their method of application are disclosed in U.S. Pat. Nos. 3,844,799 and 4,152,467, disclosures of which are incorporated herein by reference.

The copper electroless plating bath is generally an aqueous composition that includes a source of cupric ion, a reducing agent, a complexing agent for the cupric ion, and a pH adjustor. The plating baths also generally include a cyanide ion source and a surfaceactive agent.

The cupric ion source generally used is cupric sulfate or a cupric salt of the complexing agent to be employed. When using cupric sulfate, it is preferred to use amounts of about 3 g/l to about 15 g/l and most preferably from about 8 g/l to about 12 g/l. The most common reducing agent employed is formaldehyde which, in the preferred aspects, is used in amounts from about 0.7 g/l to about 7 g/l and most usually from about 0.7 g/l to about 2.2 g/l. Examples of other suitable reducing agents include formaldehyde precursors or derivatives such as paraformaldehyde, trioxane, dimethylhydantoin, and glyoxal; borohydrides such as alkali metal borohydrides (sodium or potassium borohydride) and substituted borohydrides such as sodium trimethoxy borohydride, and boranes such as amine borane (isopropyl amine borane and morpholine borane). Hypophosphite reducing agents can also be used for both electroless Ni and Cu plating baths.

Examples of some suitable complexing agents include Rochelle salts, ethylenediaminetetraacetic acid, the sodium (mono-, di-, tri-, and tetra-sodium) salts of ethylenediaminetetraacetic acid, nitrilotetraacetic acid and its alkali salts, gluconic acid, gluconates, triethanol amine, glucono ($\gamma$-lactone), modified ethylenediamine acetates such as N-hydroxy ethyl ethylenediaminetriacetate. In addition, a number of other cupric complexing agents are suggested in U.S. Pat. Nos. 2,996,408; 3,075,855; 3,075,856; and 2,938,805. The amount of complexing agent is dependent upon the amount of cupric ions present in the solution and is generally from about 20 g/l to about 50 g/l or in a 3–4 fold molar excess.

The plating bath can also contain a surfactant that assists in wetting the surface to be coated. A satisfactory surfactant is, for instance, an organic phosphate ester available under the trade designation "Gafac RE-610". Generally, the surfactant is present in amounts from about 0.02 g/l to about 0.3 g/l. In addition, the pH of the bath is also generally controlled, for instance, by the addition of a basic compound such as sodium hydroxide or potassium hydroxide in an amount to achieve the desired pH. The usual pH of the bath is between 11.6 and 11.8.

Also, the plating bath usually contains a cyanide ion and most usually contains about 10 mg/l to about 25 mg/l to provide a cyanide ion concentration in the bath within the range of 0.0002 molar to 0.0004 molar. Examples of some cyanides that can be employed are the alkali metal, alkaline earth metal, and ammonium cyanides. Also, the plating baths can include other minor additives.

The plating baths generally have a specific gravity within the range of 1.060 to 1.080. Also, the temperature of the bath is usually maintained between 70° C. and 80° C. and most usually between 70° C. and 75° C. For a discussion of the preferred plating temperatures coupled with preferred cyanide ion concentrations, see U.S. Pat. No. 3,844,799.

Also, the oxygen content of the bath can be maintained between about 2 ppm and about 4 ppm and more usually about 2.5 to about 3.5 ppm as discussed in U.S. Pat. No. 4,152,467. The oxygen content can be controlled by injecting oxygen and an inert gas into the bath. The overall flow rate of the gases in the bath is usually from 1 SCFM to about 20 SCFM per 1000 gallons of bath and more usually from about 3 SCFM to about 8 SCFM per 1000 gallons of bath.

The following non-limiting examples are presented herein to further illustrate the present invention:

EXAMPLE 1

About 76 grams of an epichlorohydrin-bisphenol-A polymer (Epon 828 from Shell Chemical Company) and about 1 gram of sodium hydroxide are dissolved in about 200 milliliters of dimethylformamide in a 2-neck 5 milliliter round bottom flask. The flask is heated to about 150° C. with agitation. About 0.5 grams of malonamide is added to the solution and when dissolved another 0.5 grams is added. This stepwise addition is continued until a total of about 5 grams of malonamide is added to the solution. The solution is maintained at about 150° C. for two additional hours. The stepwise addition of the malonamide in the excess epoxy polymer (about four-fold) is in order to assure the avoidance of rapid crosslinking of the polymer. The reaction product is poured into about 1,000 milliliters of deionized water with vigorous stirring to obtain a precipitated product which is then collected by filtration.

About 10 grams of the collected reaction product is then dissolved in about 10 grams of 1-methyl-2 pyrrolidinone. In a separate container, about 0.74 grams of palladium nitrate is dissolved in about 15 milliliters of 1-methyl-2-pyrrolidinone and about 0.8 milliliters of triethyl amine is added to the palladium nitrate solution. The palladium nitrate solution is than added to the malonamide-epoxy reaction product with good stirring. After stirring for about 1 hour, the seeded polymer is precipitated from solution by pouring into about 1,000 milliliters of deionized water with vigorous stirring and the product is collected by filtration.

A 20% solution of the product obtained is prepared in 1-methyl-2-pyrrolidinone. An equal volume of an epoxy, EPON 828 (Shell Chemical Co.) is added to the solution.

A catalyst for the epoxy is added and a film is cast on the treated side of a sacrificial copper foil and is partially cured at about 100° C. The sacrificial foil is then laminated with 8 layers of an epoxy-fiberglass prepreg. After etching in cuprous chloride, the sacrificial foil, a dark brown composite is obtained.

The surface is then etched by an oxygen-carbon tetrafluoride plasma containing about 10% carbon tetrafluoride under total pressure of about 250 millitorr. A 250 watts RF power over an 11-inch electrode is applied for about 10 minutes. The composite is then introduced into an electroless copper plating bath. The copper electroless plating bath is generally an aqueous composition that includes a source of cupric ion, a reducing agent, a complexing agent for the cupric ion, and a pH adjustor. The plating baths also generally include a cyanide ion source and a surface-active agent. Copper plated on those areas treated with the oxygen-carbontetrafluoride plasma, but did not plate on the other areas of the substrate.

EXAMPLE 2

About 380 grams of an epichlorohydrin-bisphenol-A polymer (Epon 828 from Shell Chemical Company) and about 2 grams of sodium hydroxide are dissolved in about 1000 milliliters of dimethylformamide in a 2-neck 2000 milliliter flask. The solution is heated to about 150° C. with agitation. About 25 grams of malonamide is added to the solution in 0.5 grams increments over a 6 hour period. The reaction product is allowed to cool to room temeprature and poured into about 1,000 milliliters of deionized water with vigorous stirring to obtain a precipitated product which is then collected by filtration.

About 10 grams of the collected reaction product is then dissolved in about 10 grams of 1-methyl-2 pyrrolidinone. In a separate container, about 710 milligrams of palladium nitrate are dissolved in about 25 milliliters of 1-methyl-2 pyrrolidinone. The palladium nitrate solution is than added to the malonamide-epoxy reaction product with good stirring and about .859 milliliters of triethyl amine are added. After stirring for about 1 hour, the seeded polymer is precipitated from solution by pouring into about 1,000 milliliters of deionized water with vigorous stirring and the product is collected by filtration. The product is a mixture of the Epon-828 starting material and the reaction products. The product is washed extensively with water and dried in an oven at 100° C. overnight.

A 20% solution of the product obtained is prepared in 1-methyl-2-pyrrolidinone. An equal volume of an epoxy, EPON 828 (Shell Chemical Co.) is added to the solution. A catalyst for the epoxy is added and a film is cast on the treated side of a sacrificial copper foil and is partially cured at about 100° C. The sacrificial foil is then laminated with 8 layers of an epoxy-fiberglass prepreg. After etching in cuprous chloride, the sacrificial foil, a dark brown composite is obtained.

The surface is then etched by an oxygen-carbon tetrafluoride plasma containing about 10% carbon tetrafluoride under total pressure of about 250 millitorr. A 250 watts RF power over an 11-inch electrode is applied for about 10 minutes. The composite is then introduced into an electroless copper plating bath. The copper electroless plating bath is generally an aqueous composition that includes a source of cupric ion, a reducing agent, a complexing agent for the cupric ion, and a pH adjustor. The plating baths also generally include a cyanide ion source and a surface-active agent. Copper plated on those areas treated with the oxygen-carbontetrafluoride plasma, but did not plate on the other areas of the substrate.

Having thus described our invention, what we claim as new and desire to secure by Letters Patent is:

1. A substrate suitable for plating of an active metal thereon from an electroless plating bath that comprises:
   a reaction product of a malonamide having the structural formula

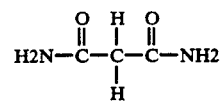

and a thermosetting polymer having groups reactive with said β-diketone and a metal complexed with said reaction product.

2. The substrate of claim 1 wherein said thermosetting polymer is selected from the group of epoxide polymer, polyimide, and polyamide.

3. The substrate of claim 1 wherein said thermosetting polymer is an epoxide polymer.

4. The substrate of claim 3 wherein said epoxide polymer is derived from epichlorohydrin and bisphenol A.

5. The substrate of claim 1 wherein the β-diketone reacts with about 0.1% to about 80% of the reactive groups of said thermosetting polymer.

6. The substrate of claim 1 wherein the thermosetting polymer is present in an amount of at least two times the amount needed to react with all of the β-diketone.

7. The substrate of claim 1 wherein said metal is a precious metal.

8. The substrate of claim 1 wherein said metal is palladium, platinum, ruthenium, nickel, copper, or mixtures thereof.

* * * * *